(12) United States Patent
Levin

(10) Patent No.: US 10,044,447 B2
(45) Date of Patent: Aug. 7, 2018

(54) LINEAR ISOLATION AMPLIFIER WITH OUTPUT DC VOLTAGE CANCELLATION

(71) Applicant: Biosense Webster (Israel) Ltd., Yokneam (IL)

(72) Inventor: Michael Levin, Haifa (IL)

(73) Assignee: BIOSENSE WEBSTER (ISRAEL) LTD., Yokneam (IL)

( * ) Notice: Subject to any disclaimer, the term of this patent is extended or adjusted under 35 U.S.C. 154(b) by 186 days.

(21) Appl. No.: 15/089,703

(22) Filed: Apr. 4, 2016

(65) Prior Publication Data
US 2017/0288785 A1    Oct. 5, 2017

(51) Int. Cl.
| | |
|---|---|
| *H04B 10/00* | (2013.01) |
| *H03F 17/00* | (2006.01) |
| *H04B 10/80* | (2013.01) |
| *H03F 3/45* | (2006.01) |

(52) U.S. Cl.
CPC ............. *H04B 10/802* (2013.01); *H03F 3/45* (2013.01); *H03F 2200/171* (2013.01); *H03F 2200/264* (2013.01); *H03F 2200/375* (2013.01)

(58) Field of Classification Search
CPC .......... H04F 220/171; H03F 2200/264; H03F 2200/375; H03F 3/45; H03F 2200/171; H04B 10/802
USPC ............................ 398/116, 115; 330/59, 308
See application file for complete search history.

(56) References Cited

U.S. PATENT DOCUMENTS

| | | | | |
|---|---|---|---|---|
| 3,893,037 A * | 7/1975 | Herbert | ................... | H03F 3/087 330/59 |
| 4,078,156 A | 3/1978 | Langan | | |
| 4,297,638 A | 10/1981 | LaFrance | | |
| 4,313,225 A * | 1/1982 | Carbrey | ................ | H04M 1/003 250/551 |
| 4,384,259 A * | 5/1983 | Capewell | ................ | H02M 3/00 136/293 |

(Continued)

OTHER PUBLICATIONS

Vishay Semiconductors, Designing Linear Amplifiers Using the IL300 Optocoupler, Application Note 50, pp. 1-19: www.vishay.com, Mar. 2012.

(Continued)

*Primary Examiner* — Amritbir Sandhu
(74) *Attorney, Agent, or Firm* — Notaro, Michalos & Zaccaria P.C.

(57) ABSTRACT

An electronic circuit includes an isolation amplifier, having a first input terminal receiving an AC-signal and including a linear opto-isolator. The opto-isolator has a first output terminal that provides a unipolar signal having an AC-component proportional to the input signal. The circuit includes a transimpedance receiver with first and second operational amplifiers. The first amplifier has a second output terminal and first and second differential input terminals, with the first differential input terminal receiving and amplifying the unipolar output signal from the first output terminal providing an output signal from the circuit at the second output terminal. The second amplifier is configured as an integrator, having a third output terminal coupled to the second differential input terminal and having third and fourth differential input terminals, with the third differential input terminal receiving the output signal from the second output terminal and the fourth differential input terminal connected to ground.

10 Claims, 4 Drawing Sheets

(56) References Cited

U.S. PATENT DOCUMENTS

| | | | | |
|---|---|---|---|---|
| 4,385,286 | A | 5/1983 | Haque | |
| 4,536,715 | A * | 8/1985 | Basarath | H03F 3/38 330/2 |
| 4,546,262 | A * | 10/1985 | Huggins | G01R 15/22 250/551 |
| 4,591,800 | A | 5/1986 | Opas | |
| 5,191,298 | A * | 3/1993 | Funahashi | H03F 1/302 330/124 R |
| 5,245,654 | A * | 9/1993 | Wilkison | H04M 7/0096 379/345 |
| 5,278,515 | A * | 1/1994 | Mathews | H03F 3/085 250/214 A |
| 5,760,939 | A * | 6/1998 | Nagarajan | B82Y 20/00 372/34 |
| 6,181,264 | B1 | 1/2001 | Felps | |
| 6,188,276 | B1 | 2/2001 | Simopoulos | |
| 6,956,439 | B1 * | 10/2005 | Devnath | H03F 1/26 330/259 |
| 7,394,995 | B2 * | 7/2008 | Audic | H04B 10/673 250/214 A |
| 8,222,590 | B2 * | 7/2012 | Suzuki | H03F 3/08 250/214 A |
| 8,461,922 | B2 * | 6/2013 | Norman | H03F 3/45973 330/69 |
| 8,983,304 | B2 * | 3/2015 | Tay | H04B 10/802 398/158 |
| 9,484,913 | B2 * | 11/2016 | Baranwal | H03K 17/567 |
| 9,490,802 | B2 * | 11/2016 | Shi | H04B 10/802 |
| 2003/0141935 | A1 * | 7/2003 | Chen | H03F 3/45206 330/301 |
| 2007/0170171 | A1 * | 7/2007 | Shah | G01R 19/0084 219/497 |
| 2009/0088122 | A1 * | 4/2009 | Xu | H03D 7/1441 455/333 |
| 2009/0175624 | A1 * | 7/2009 | Loh | G06F 13/4072 398/116 |
| 2009/0212856 | A1 * | 8/2009 | Chen | H03F 3/45973 330/9 |
| 2010/0155627 | A1 * | 6/2010 | Baumgartner | H04B 10/299 250/551 |
| 2011/0215870 | A1 | 9/2011 | Lao et al. | |
| 2012/0154032 | A1 * | 6/2012 | Lesso | H03F 1/304 330/109 |
| 2012/0175504 | A1 * | 7/2012 | Holland | H04B 10/802 250/214 A |
| 2012/0241599 | A1 * | 9/2012 | Uemura | H04B 10/69 250/214.1 |
| 2013/0328627 | A1 * | 12/2013 | Krohn | A61B 5/7203 330/149 |
| 2017/0288785 | A1 * | 10/2017 | Levin | H04B 10/802 |

OTHER PUBLICATIONS

Extended European Patent Search Report for corresponding European Patent Application EP 17161108, dated Sep. 6, 2017.

* cited by examiner

LINEAR ISOLATION AMPLIFIER WITH OUTPUT DC VOLTAGE CANCELLATION

FIELD OF THE INVENTION

The present invention relates generally to electronic circuits, and particularly to linear isolation amplifiers.

BACKGROUND

It is commonly required that an electronic signal, either a voltage or current signal, be transmitted from one part of an electronic circuit to another part of the circuit, without any ohmic contact between the two parts. An example of such a case is provided by a circuit of which one part is in contact with a human, such as when a patient is monitored by one part of the circuit, and the other part is connected to external electronic equipment. Providing complete ohmic isolation between the two parts of the circuit ensures that an electronic malfunction in the external electronic equipment will not cause a harmful current to flow through the patient. A widely used electronic circuit for passing signals, while isolating the two parts of the circuit, is a linear isolation amplifier, based on a linear opto-coupler. The term "signal" is used in the present description and in the claims to denote an electronic voltage or current signal, unless otherwise specified.

The linear opto-coupler transmits a signal through one or more pairs of an optical emitter and a receiver, so that the electronic signal is translated first into an optical signal and then back into an electronic signal. Due to the asymmetrical construction of the emitter-receiver pairs and the non-conducting (dielectric) gap transmitting the emitted photons, the signal will travel in one direction only, without any possibility of a reverse current flowing towards the patient. The use of a photonic circuit, however, imposes a condition of unipolarity on the transmitted signal. (For the sake of clarity, the following description refers to positive unipolar signals, as well as positive reference and threshold voltages, but negative unipolar signals, together with negative offset and threshold voltages, may be used in a similar fashion.) In addition to the requirement of positive unipolarity, due to the fact that photonic emitters exhibit linear behavior only above a threshold excitation above zero, the minimum value of the transmitted signal is generally set to be above this threshold.

When the signal to be transmitted is a pure AC-signal, it is converted to a positive unipolar signal before being input to the linear opto-coupler. This conversion may be accomplished by a pre-amplifier within the linear isolation amplifier, which pre-amplifier adds a fixed, positive DC-reference voltage to the AC-signal, thus creating a positive unipolar signal with a sufficiently high positive minimum value. Once the positive unipolar signal has been passed through the linear opto-coupler, its AC-component can be recovered.

SUMMARY

Embodiments of the present invention that are described hereinbelow provide improved isolation circuits and a method for their use.

There is therefore provided, in accordance with an embodiment of the present invention, an electronic circuit, including an isolation amplifier, having a first input terminal coupled to receive an input AC-signal and including a linear opto-isolator, which has a first output terminal and is coupled to provide at the first output terminal a unipolar signal, having an AC-component proportional to the input signal, and a transimpedance receiver, including a first operational amplifier, having a second output terminal and first and second differential input terminals, with the first differential input terminal coupled to receive and amplify the unipolar output signal from the first output terminal so as to provide an output signal from the circuit at the second output terminal, and a second operational amplifier, which is configured as an integrator, and which has a third output terminal coupled to the second differential input terminal and has third and fourth differential input terminals, with the third differential input terminal coupled to receive the output signal from the second output terminal and the fourth differential input terminal connected to a ground.

In some embodiments, the transimpedance receiver includes an input resistor and a feedback capacitor coupled to the second operational amplifier, with values chosen so that the transimpedance receiver functions as an AC-coupling amplifier configured as a high-pass filter. In a disclosed embodiment, the high-pass filter is a single-pole high-pass filter.

In a further disclosed embodiment, the output signal at the second output terminal has a zero DC-component.

In still other embodiments, the isolation amplifier has a second input terminal coupled to receive a reference DC-voltage while the transimpedance receiver generates the output signal without using any reference DC-voltage.

There is also provided, in accordance with an embodiment of the present invention, a method for producing an electronic circuit, the method including providing an isolation amplifier, having a first input terminal coupled to receive an input AC-signal and including a linear opto-isolator, which has a first output terminal and is coupled to provide at the first output terminal a unipolar signal, having an AC-component proportional to the input signal, and providing a transimpedance receiver, including a first operational amplifier, having a second output terminal and first and second differential input terminals, with the first differential input terminal coupled to receive and amplify the unipolar output signal from the first output terminal so as to provide an output signal from the circuit at the second output terminal, and a second operational amplifier, which is configured as an integrator, and which has a third output terminal coupled to the second differential input terminal and has third and fourth differential input terminals, with the third differential input terminal coupled to receive the output signal from the second output terminal and the fourth differential input terminal connected to a ground.

There is additionally provided, in accordance with an embodiment of the present invention, a method, wherein the transimpedance receiver includes an input resistor and a feedback capacitor coupled to the second operational amplifier, with values chosen so that the transimpedance receiver functions as an AC-coupling amplifier configured as a high-pass filter.

There is further provided, in accordance with an embodiment of the present invention, a method, wherein the high-pass filter is a single-pole high-pass filter.

There is provided, in accordance with an embodiment of the present invention, a method, wherein the output signal at the second output terminal has a zero DC-component.

There is further provided, in accordance with an embodiment of the present invention, a method, wherein the isolation amplifier has a second input terminal coupled to receive a reference DC-voltage while the transimpedance receiver generates the output signal without using any reference DC-voltage.

The present invention will be more fully understood from the following detailed description of the embodiments thereof, taken together with the drawings in which:

DETAILED DESCRIPTION OF EMBODIMENTS

Figure 1:
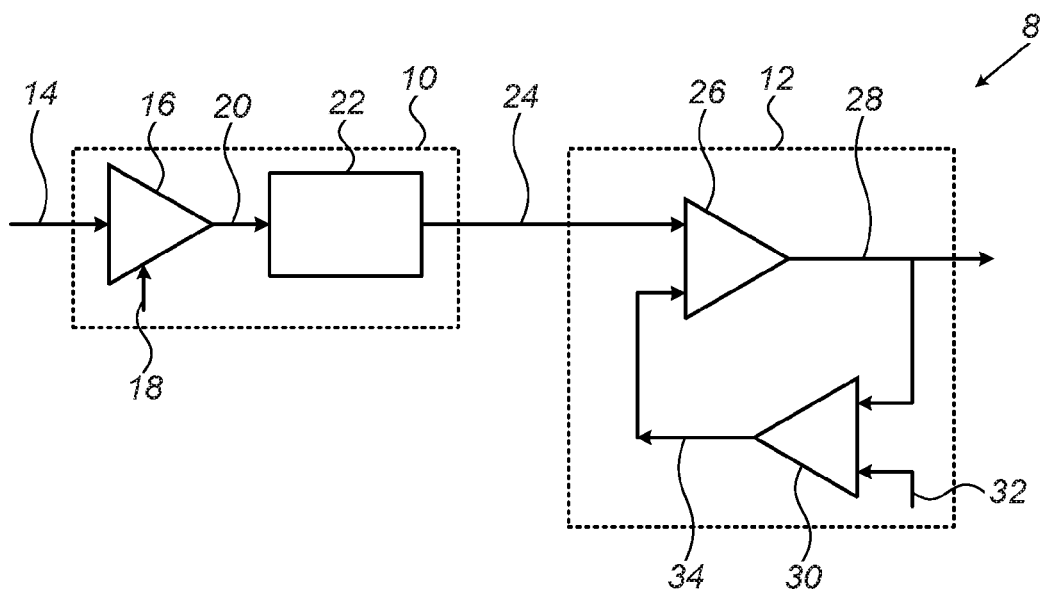
FIG. 1 is a schematic block diagram of an electronic circuit, in accordance with an embodiment of the invention.

As noted earlier, in order for an AC-signal to be transmitted correctly by a linear opto-coupler that is part of a linear isolation amplifier, the AC-signal originating from a sensor is converted to a positive unipolar signal before presenting it as an input to the linear opto-coupler. This conversion is accomplished by adding to the AC-signal a positive DC offset voltage. The positive DC offset voltage is based on a reference DC-voltage on the input side of the linear opto-coupler. Due to the requirement of ohmic isolation between the input and output sides of the linear opto-coupler, this reference DC-voltage is not accessible at the output side of the linear opto-coupler. Once the positive unipolar signal has been transmitted to the output terminal of the linear isolation amplifier, the DC offset voltage is removed in order to recover the initial AC-signal. When a second reference DC-voltage is used for this purpose, any discrepancy between the reference voltages on the input and output sides of the isolation amplifier, such as a voltage difference or a time-dependent drift, will distort the recovered AC-signal by a residual DC-voltage offset.

An embodiment of the present invention described herein circumvents the problem inherent in the use of two reference voltages by applying a method of high-pass filtering to the output signal from the linear isolation amplifier, without using any second reference DC-voltage. By choosing the frequency response of the high-pass filter appropriately, it will filter out the DC-voltage component of the output signal, while transmitting in an undistorted fashion the AC-component of the output signal.

In some embodiments, the high-pass filtering is accomplished by a transimpedance receiver, which is configured as an AC-coupling amplifier. As will be described in detail below, the transimpedance receiver comprises an operational amplifier, wherein one of the differential input terminals of the operational amplifier receives the output signal from the linear isolation amplifier. The output terminal of the operational amplifier is connected to one of the differential input terminals of a second operational amplifier, which is configured as an integrator. The second differential input terminal of the integrator (second operational amplifier) is connected to ground potential. The output terminal of the integrator is connected to the second differential input terminal of the first operational amplifier, providing a negative feedback to this operational amplifier, and ensuring that the DC-component of the output signal of the first operational amplifier is always zero.

Thus, the output signal of the first operational amplifier, with a zero DC-component, faithfully replicates the initial input AC-signal. As will be described in detail below, the design of the high-pass filter, and specifically that of the integrator, can be chosen in such a way that the act of filtering out the DC-component has no detrimental effect on the AC-signal. Specifically, when designing the high-pass filter as a single-pole filter, the position of the cut-off frequency can be chosen well below the frequency spectrum of the AC-signal, while still well above zero frequency (DC).

This novel combination of a linear isolation amplifier and a transimpedance receiver, with the latter configured as a high-pass filter, is advantageous for transmitting AC-signals in an ohmically isolated way, since no second reference DC-voltage is required. In addition, the recovered AC-signal is free of distortion due to DC reference mismatch or temporal drift. Furthermore, an embodiment of the present invention may be applied to any linear isolation amplifier available from the manufacturers of such devices.

FIG. 1 is a schematic block diagram of an isolation circuit 8, in accordance with an embodiment of the present invention. The two major parts of circuit 8 are a linear isolation amplifier 10 and a transimpedance receiver 12, outlined by broken lines in this figure. An input AC-signal 14 is connected to an input terminal of a pre-amplifier 16 within linear isolation amplifier 10. In pre-amplifier 16, a positive reference DC-voltage 18 is added to input AC-signal 14, producing a positive unipolar signal 20 at the output terminal of pre-amplifier 16. Signal 20 is used as an input to a linear opto-isolator 22 within linear isolation amplifier 10, and opto-isolator 22 converts signal 20 to a positive unipolar output signal 24, ohmically isolated from signal 20.

Signal 24 forms an input signal to transimpedance receiver 12, where signal 24 is connected to a differential input terminal of an operational amplifier circuit 26 within transimpedance receiver 12. Operational amplifier circuit 26 forms an output signal 28, which is connected to a differential input terminal of an integrator 30 within transimpedance receiver 12. A second differential input terminal of integrator 30 is connected to ground potential via a connection 32. An output signal 34 of integrator 30 is connected to a second differential input terminal of operational amplifier circuit 26, providing negative feedback to operational amplifier circuit 26, and ensuring that output signal 28 has zero DC-component and that output signal 28 recovers original input AC-signal 14.

FIGS. 2-5 are schematic representations of the signal voltages at various locations in circuit 8 of FIG. 1, with additional references to FIG. 1. The horizontal axis represents time, and the vertical axis represents the voltage of a signal.

Figure 2:
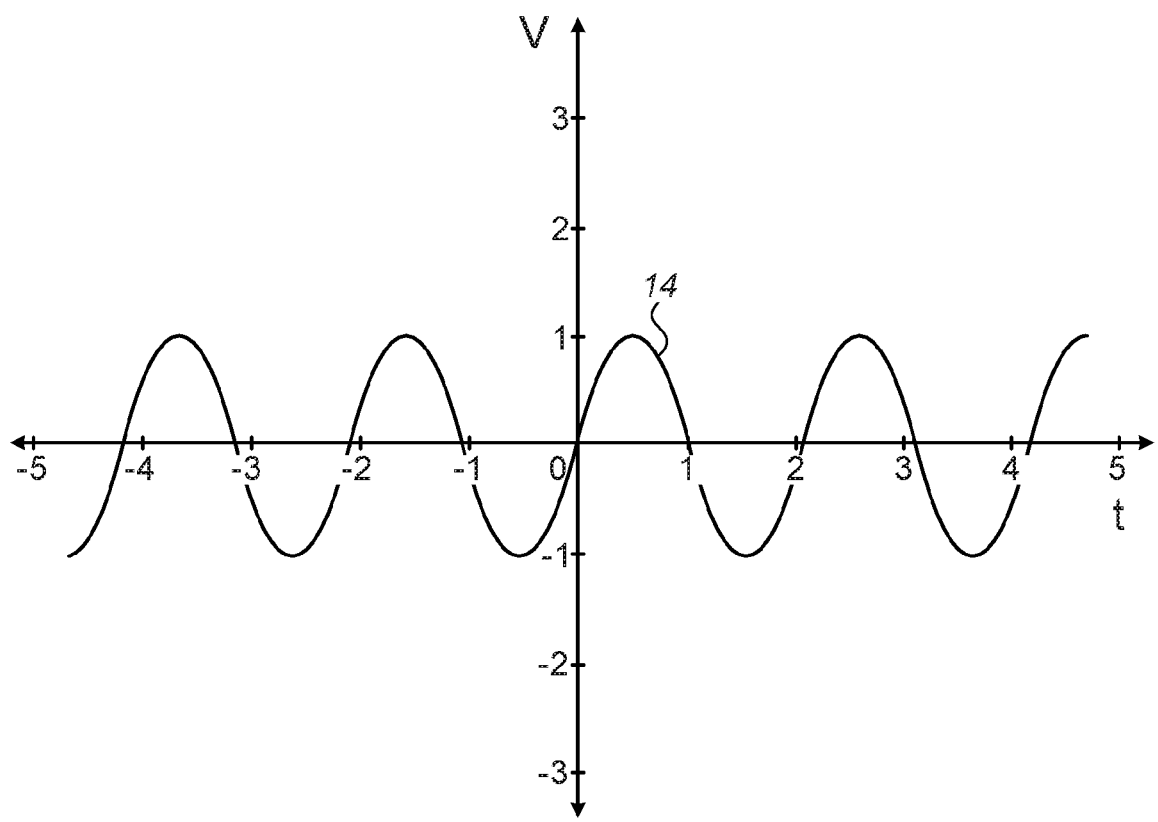
FIG. 2 is a schematic diagram of an input AC-signal to a linear isolation amplifier, in accordance with an embodiment of the invention.

FIG. 2 is a schematic representation of input AC-signal 14. Input AC-signal 14 has only an AC-component, with zero DC-component.

Figure 3:
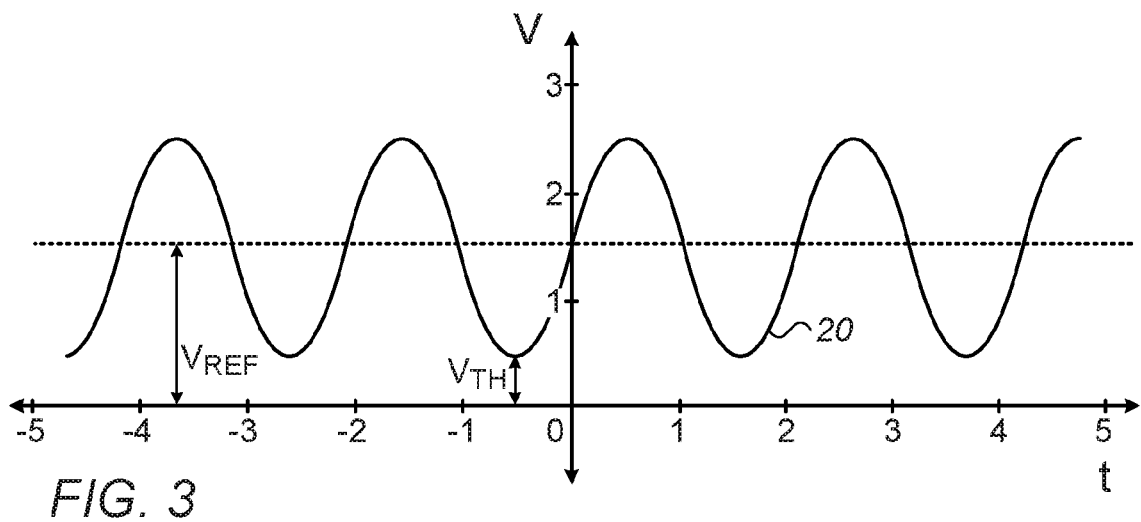
FIG. 3 is a schematic diagram of a positive unipolar input signal to a linear opto-coupler, in accordance with an embodiment of the invention.

FIG. 3 is a schematic representation of positive unipolar signal 20, which is the output signal from pre-amplifier 16, after adding positive reference DC-voltage 18 to input AC-signal 14. The magnitude of positive reference DC-voltage 18 is denoted as $V_{REF}$ in FIG. 3. The minimum value of positive unipolar signal 20, as required for proper functioning of linear opto-coupler 22, is denoted by $V_{TH}$ in FIG. 3.

Figure 4:
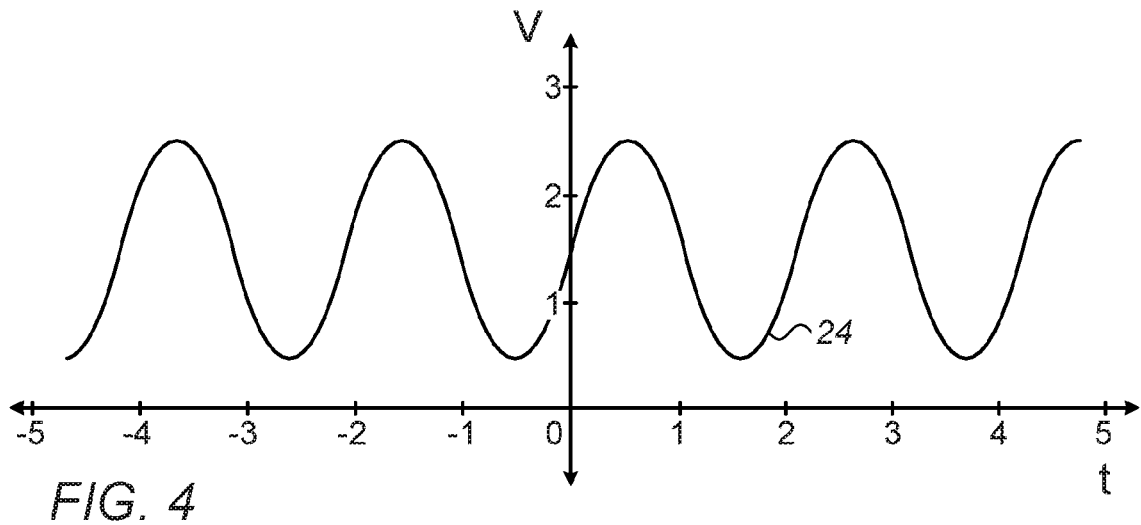
FIG. 4 is a schematic diagram of a positive unipolar output signal from a linear opto-coupler, in accordance with an embodiment of the invention.

FIG. 4 is a schematic representation of output signal 24 from linear opto-isolator 22. Assuming for the sake of simplicity a unity gain for linear opto-isolator 22, output signal 24 is an exact reproduction of positive unipolar signal 20.

Figure 5:
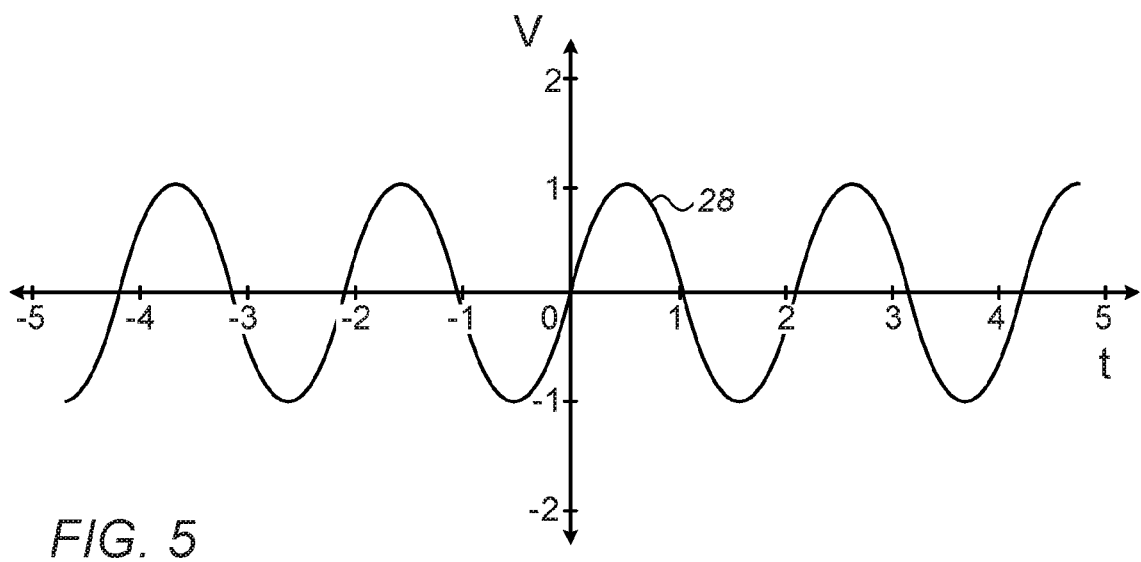
FIG. 5 is a schematic diagram of an output signal from a transimpedance receiver, in accordance with an embodiment of the invention.

FIG. 5 is a schematic representation of output signal 28, wherein the DC-component present in output signal 24 has been removed due to the transimpedance receiver 12 functioning as an AC-coupling amplifier, and wherein the remaining AC-component is a faithful reproduction of input AC-signal 14.

Figure 6A:
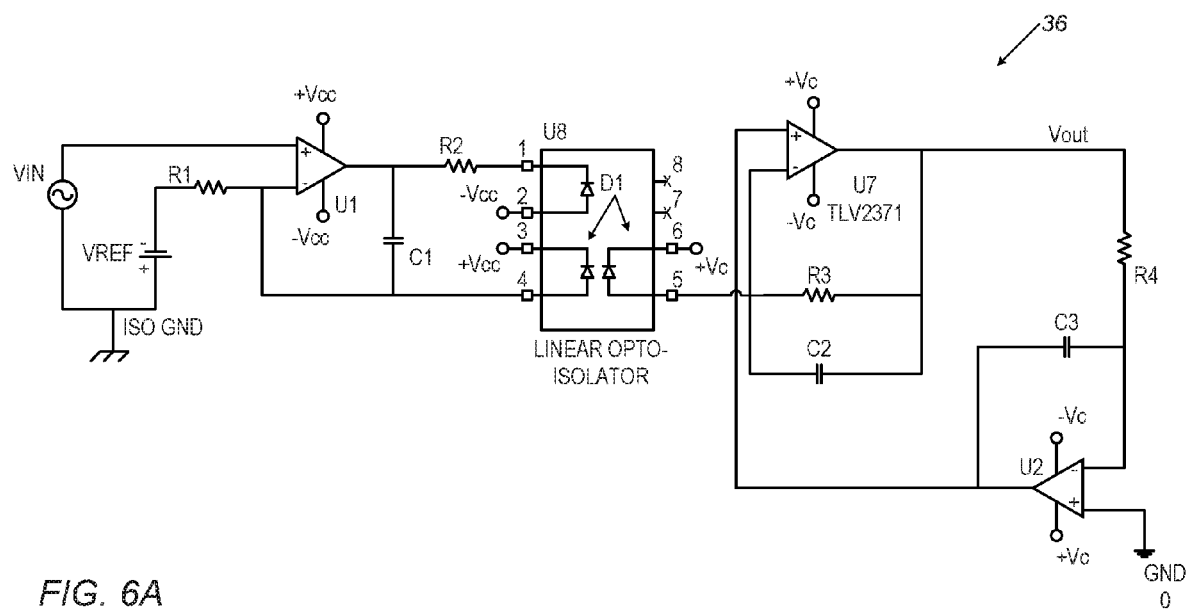
FIGS. 6A-6B are diagrams of an electronic circuit, in accordance with an embodiment of the invention.

FIG. 6A is a schematic representation of an electronic circuit 36 according to an embodiment of the present invention. For the sake of clarity, FIG. 6A shows electronic circuit 36 using common electronic circuit notation. Typical values or types of the electronic components in electronic circuit 36 are given in Table 1, below, and those having ordinary skill in the art will be aware of variations in these values and types.

TABLE 1

| Component | Function | Type/Value |
|---|---|---|
| R1 | Resistor | 30.1 kΩ |
| U1 | Operational amplifier | TLV2371 |
| C1 | Capacitor | 100 pF |
| R2 | Resistor | 604 Ω |
| U8 | Linear opto-isolator | IL300 |
| U7 | Operational amplifier | TLV2371 |
| R3 | Resistor | 30.1 kΩ |
| C2 | Capacitor | 100 pF |
| C3 | Capacitor | 10 µF |
| U2 | Operational amplifier | TLV2371 |
| R4 | Resistor | 100 kΩ |

Typical supply voltages of electronic circuit 36 are given in Table 2, below.

TABLE 2

| Supply voltage symbol | Voltage |
|---|---|
| +Vcc | +5 V |
| −Vcc | −5 V |
| +Vc | +5 V |
| −Vc | −5 V |

Additional explanations and clarifications of electronic circuit 36 are given in the following figure, FIG. 6B.

Figure 6B:
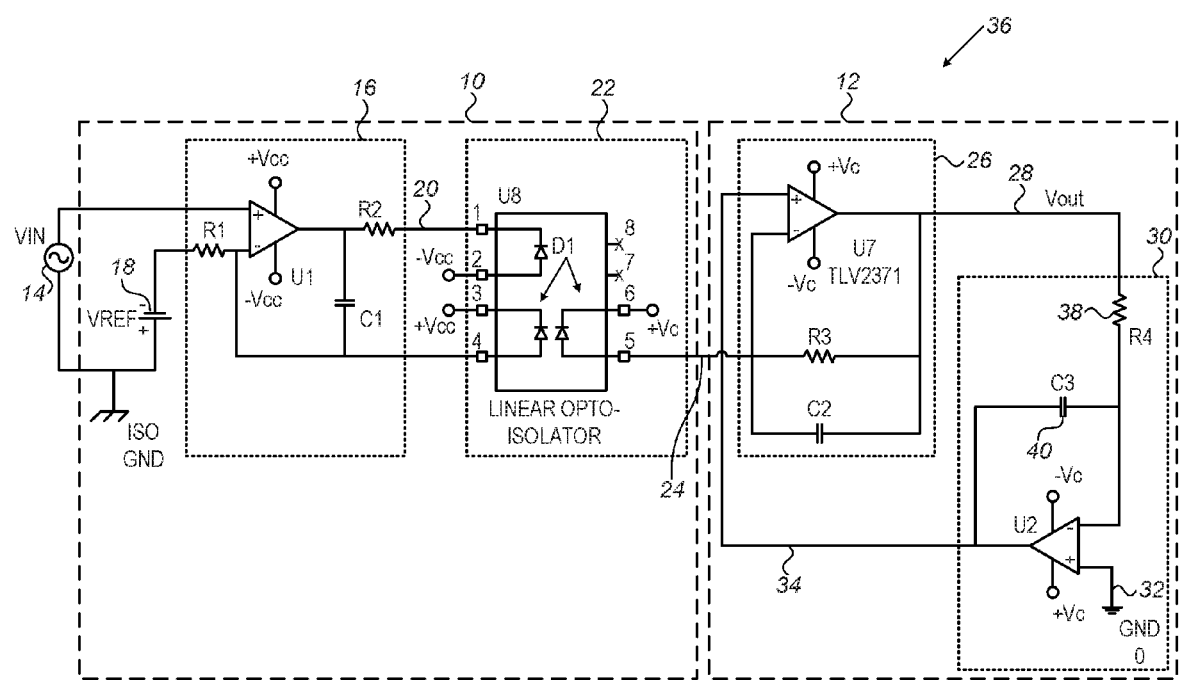

FIG. 6B is a schematic representation of electronic circuit 36, with additional references to the functional elements of circuit 8 of FIG. 1. The major functional circuit components, linear isolation amplifier 10 and transimpedance receiver 12, are outlined in broken lines in electronic circuit 36. The internal circuit components of isolation amplifier 10 and transimpedance receiver 12—pre-amplifier 16, linear opto-isolator 22, operational amplifier circuit 26, and integrator 30—are further outlined in broken lines within the major functional circuit components. Signals and reference voltages are labelled in accordance with FIG. 1.

Pre-amplifier 16 comprises an operational amplifier U1, where the voltage between the differential input terminals is the sum of the input AC-signal 14 (labelled VIN in circuit diagram 36) and reference DC-voltage 18 (labelled VREF in circuit diagram 36). A resistor R1 determines the forward current through a diode D1. A resistor R2 limits the maximum current value through diode D1 and an output capacitor C1 prevents potential parasitic oscillations.

Operational amplifier circuit 26 comprises an operational amplifier U7, with a resistor R3 determining the output stage gain, and a capacitor C2 controlling its frequency behavior. Integrator 30 comprises an operational amplifier U2, as well as an input resistor 38 (R4) and a feedback capacitor 40 (C3), whose function will be described below. The combination of integrator 30 and operational amplifier circuit 26 functions as an AC coupling amplifier with a single-pole high-pass filter response.

The functional characteristics of integrator 30 are controlled by resistor 38 and capacitor 40. Denoting the values of these components, in accordance with the drawing of electronic circuit 36, by R4 for resistor 38 and by C3 for capacitor 40, the cut-off frequency $f_{CUTOFF}$ of the high-pass filter can be calculated to be $$f_{CUTOFF} = \frac{1}{2\pi R4 C3}$$

When the cut-off frequency $f_{CUTOFF}$ is chosen so that it is well below the frequency spectrum of input AC-signal 14, while still being well above zero frequency (DC), input AC-signal 14 will be faithfully reproduced at output signal 28, without any residual DC-signal.

Although FIGS. 6A and 6B show a particular electronic configuration and choice of circuit components, by way of example, the principles of circuit 8 may alternatively be implemented using other circuit components and component values, as will be apparent to those skilled in the art. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An electronic circuit, comprising:
    an isolation amplifier, having a first input terminal coupled to receive an input AC-signal and a linear opto-isolator, which has a first output terminal and is coupled to provide at the first output terminal a unipolar signal, having an AC-component proportional to the input AC signal; and
    a transimpedance receiver, comprising:
        a first operational amplifier, having a second output terminal and a first differential input terminal and a second differential input terminal, with the first differential input terminal coupled to receive and amplify the unipolar signal output from the first output terminal so as to provide an output signal from the first operational amplifier circuit at the second output terminal; and
        a second operational amplifier, which is configured as an integrator, and which has a third output terminal coupled to the second differential input terminal and has a third differential input terminal and a fourth differential input terminal, with the third differential input terminal coupled to receive the output signal from the second output terminal and the fourth differential input terminal connected to a ground.

2. The electronic circuit according to claim 1, wherein the transimpedance receiver comprises an input resistor and a feedback capacitor coupled to the second operational amplifier, with values chosen so that the transimpedance receiver functions as an AC-coupling amplifier configured as a high pass filter.

3. The electronic circuit according to claim 2, wherein the high-pass filter comprises a single-pole high-pass filter.

4. The electronic circuit according to claim 1, wherein the output signal at the second output terminal has a zero DC-component.

5. The electronic circuit according to claim 1, wherein the isolation amplifier has a second input terminal coupled to receive a reference DC-voltage while the transimpedance receiver generates the output signal without using the reference DC-voltage.

6. A method for producing an electronic circuit, the method comprising:
   providing an isolation amplifier, having a first input terminal coupled to receive an input AC-signal and a linear opto-isolator, which has a first output terminal and is coupled to provide at the first output terminal a unipolar signal, having an AC-component proportional to the input AC signal; and
   providing a transimpedance receiver, comprising:
      a first operational amplifier, having a second output terminal and a first differential input terminal and a second differential input terminal, with the first differential input terminal coupled to receive and amplify the unipolar signal output from the first output terminal so as to provide an output signal from the first operational amplifier circuit at the second output terminal; and
      a second operational amplifier, which is configured as an integrator, and which has a third output terminal coupled to the second differential input terminal and has a third differential input terminal and a fourth differential input terminal, with the third differential input terminal coupled to receive the output signal from the second output terminal and the fourth differential input terminal connected to a ground.

7. The method according to claim 6, wherein the transimpedance receiver comprises an input resistor and a feedback capacitor coupled to the second operational amplifier, with values chosen so that the transimpedance receiver functions as an AC-coupling amplifier configured as a high-pass filter.

8. The method according to claim 7, wherein the high-pass filter comprises a single-pole high-pass filter.

9. The method according to claim 6, wherein the output signal at the second output terminal has a zero DC-component.

10. The method according to claim 6, wherein the isolation amplifier has a second input terminal coupled to receive a reference DC-voltage while the transimpedance receiver generates the output signal without using the reference DC-voltage.

* * * * *